United States Patent
Nakao

(10) Patent No.: US 8,494,181 B2
(45) Date of Patent: Jul. 23, 2013

(54) METHOD FOR PROVIDING A MUTE CONTROL FUNCTION FOR MULTIPLE MICROPHONES CONNECTED TO A COMPUTER

(75) Inventor: Takenobu Nakao, Tokyo (JP)

(73) Assignee: Lenovo (Singapore) Pte Ltd., Singapore (SG)

( * ) Notice: Subject to any disclaimer, the term of this patent is extended or adjusted under 35 U.S.C. 154(b) by 558 days.

(21) Appl. No.: 12/782,919

(22) Filed: May 19, 2010

(65) Prior Publication Data

US 2010/0310095 A1 Dec. 9, 2010

(30) Foreign Application Priority Data

Jun. 8, 2009 (JP) .................................. 2009-136961

(51) Int. Cl.
*H04B 15/00* (2006.01)
*H04R 5/00* (2006.01)

(52) U.S. Cl.
USPC ........................................... 381/94.5; 381/26

(58) Field of Classification Search
USPC ................ 381/26, 1–2, 92, 123, 91, 94, 94.2, 381/94.5, 56, 57, 300, 81, 77, 76, 79; 700/94; 348/14–16; 379/11–16
See application file for complete search history.

(56) References Cited

U.S. PATENT DOCUMENTS

| | | | | |
|---|---|---|---|---|
| 7,991,163 | B2 * | 8/2011 | Loether | 381/26 |
| 2007/0021205 | A1 * | 1/2007 | Filer et al. | 463/36 |
| 2007/0297394 | A1 * | 12/2007 | Allan et al. | 370/356 |
| 2012/0014534 | A1 * | 1/2012 | Bodley et al. | 381/77 |

FOREIGN PATENT DOCUMENTS

| | | |
|---|---|---|
| JP | 2000-217200 | 8/2000 |
| JP | 2005-063450 | 3/2005 |
| JP | 2005-080265 | 3/2005 |
| JP | 2009-055451 | 3/2009 |
| JP | 2009-088921 | 4/2009 |

\* cited by examiner

*Primary Examiner* — Fan Tsang
*Assistant Examiner* — Eugene Zhao
(74) *Attorney, Agent, or Firm* — Anthony P. Ng; Yudell Isidore Ng Russell PLLC

(57) ABSTRACT

A method for providing a mute control function in a computer having multiple microphones is disclosed. A set of mute state information is stored in a control table of a portable computer. The mute state information is for controlling a mute state. Device identifiers (IDs) of all microphones that are connected to the portable computer are registered with the control table. The microphones corresponding to the device IDs registered in the control table are controlled to be in the same mute state based on the mute state information. In response to a detection of an activation of the mute button, the mute state information are inverted. The device IDs registered in the control table are to be controlled in the same mute state based on the inverted mute state information.

15 Claims, 4 Drawing Sheets

METHOD FOR PROVIDING A MUTE CONTROL FUNCTION FOR MULTIPLE MICROPHONES CONNECTED TO A COMPUTER

PRIORITY CLAIM

The present application claims benefit of priority under 35 U.S.C. §§120, 365 to the previously filed Japanese Patent Application No. JP2009-136961 entitled, "Mute Control of Microphone" with a priority date of Jun. 8, 2009, which is incorporated by reference herein.

BACKGROUND

1. Technical Field

The present invention relates to microphone controls in general, and in particular to a method for providing a mute control function in a computer to which multiple microphones are connected.

2. Description of Related Art

In audio devices, a mute (silencing) control is generally utilized to prevent audio signals from being output as sound via speakers. A laptop personal computer (laptop PC) is commonly equipped with audio devices such as speakers or microphones. Among the audio devices connected to the laptop PC, the mute control function has been performed on speakers only. In a laptop PC, speakers are used for output of audio signals generated by various audio application programs operating in the laptop PC. When speakers are connected to the laptop PC, the respective applications are able to share one or more speakers to output respective audio signals through the shared speakers. The laptop PC typically has a mute button for controlling mute function. When the mute button is pressed, none of the applications will be able to output audio signals through speakers.

An operating system (OS) such as Windows Vista® provides a window called an audio mixer, which is a user interface, to allow for a mute control of speakers. The audio mixer includes a slider (i.e., parent slider) or trackbar for volume control and an operation button (i.e., a parent button) for mute control so as to correspond to a main speaker or each of respective external speakers. Moreover, whenever a new application is started, a slider (i.e., child slider) and an operation button (i.e., a child button) corresponding to the application are added in the audio mixer window.

If a user "mouse-clicks" on an icon of a parent button when the respective audio data of various applications are output through one speaker, the icon of the parent button is changed to a mute state, and the icons of all child buttons are also changed to the mute state, whereby sound output through the speakers is stopped. When the user "mouse-clicks" the parent button again, the icon of the parent button and the icons of all child buttons are changed to an unmute state and sound is output through the speakers again. When the user "mouse-clicks" a certain child button in a state where the parent button and all child buttons are in the mute state, the parent button and the clicked child button are changed to the unmute state, and audio data from a corresponding application are output through the speakers.

When the parent buttons are in the unmute state, by clicking the respective child buttons one by one, it is possible to designate only the corresponding application into the mute or unmute state. A child button of an application newly started in the mute state of the parent button will be in the same mute state as the parent button, and the audio data of that application will not be output through speakers. A child button of an application newly started in the unmute state of the parent button will be in the same unmute state as the parent button, and the audio data of that application will be output through speakers.

A volume control enables the operation of respective child sliders independently with a mouse to control the volume of audio signals from the corresponding application. Moreover, when the parent slider is operated by mouse dragging, all child sliders are moved along with the mouse dragging. For example, when the parent slider is set to 100% and two child sliders are set to 50% and 40%, respectively, if the parent slider is changed to 50%, the child sliders will be changed to 25% and 20%, respectively. Such mute control and volume control can be performed for each speaker.

According to one prior art technique, a mute group is set for certain channels selected from the plural channels, and a mute volume level is set for the mute group by an imaginary group master on/off switch displayed in an LCD on a console.

According to another prior art technique, when a headphone is connected to one of a group of surround speakers that are connected to an audio signal transmitting apparatus, the audio signal transmitting apparatus is able to acquire information that a headphone is connected thereto. Moreover, when the audio signal transmitting apparatus acquires the information that one of the group of surround speakers is connected thereto, the audio signal transmitting apparatus is able to control speakers thereof so as to stop (mute) an external output from the speakers. In addition, when the audio signal transmitting apparatus acquires the information that one of the group of surround speakers is connected thereto, the audio signal transmitting apparatus is able to control speaker units of other surround speakers so as to stop an external output from the speaker units.

Also, whether audio signals received by an audio signal receiving apparatus will be output as an external output or a headphone output is controlled using CH mapping information generated by the audio signal transmitting apparatus. When the number of external connection apparatuses being connected to the audio signal transmitting apparatus is updated or an operation state of the external connection apparatus being connected is changed, the CH mapping information used presently is changed.

The present disclosure describes a method for providing a mute control function for multiple microphones that are connected to a computer.

SUMMARY

In accordance with a preferred embodiment of the present invention, a set of mute state information is stored in a control table of a portable computer. The mute state information is for controlling a mute state. Device identifiers (IDs) of all microphones that are connected to the portable computer are registered with the control table. The microphones corresponding to the device IDs registered in the control table are controlled to be in the same mute state based on the mute state information. In response to a detection of an activation of the mute button, the mute state information are inverted. The device IDs registered in the control table are to be controlled in the same mute state based on the inverted mute state information.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

[Configuration of Laptop PC]

Figure 1:
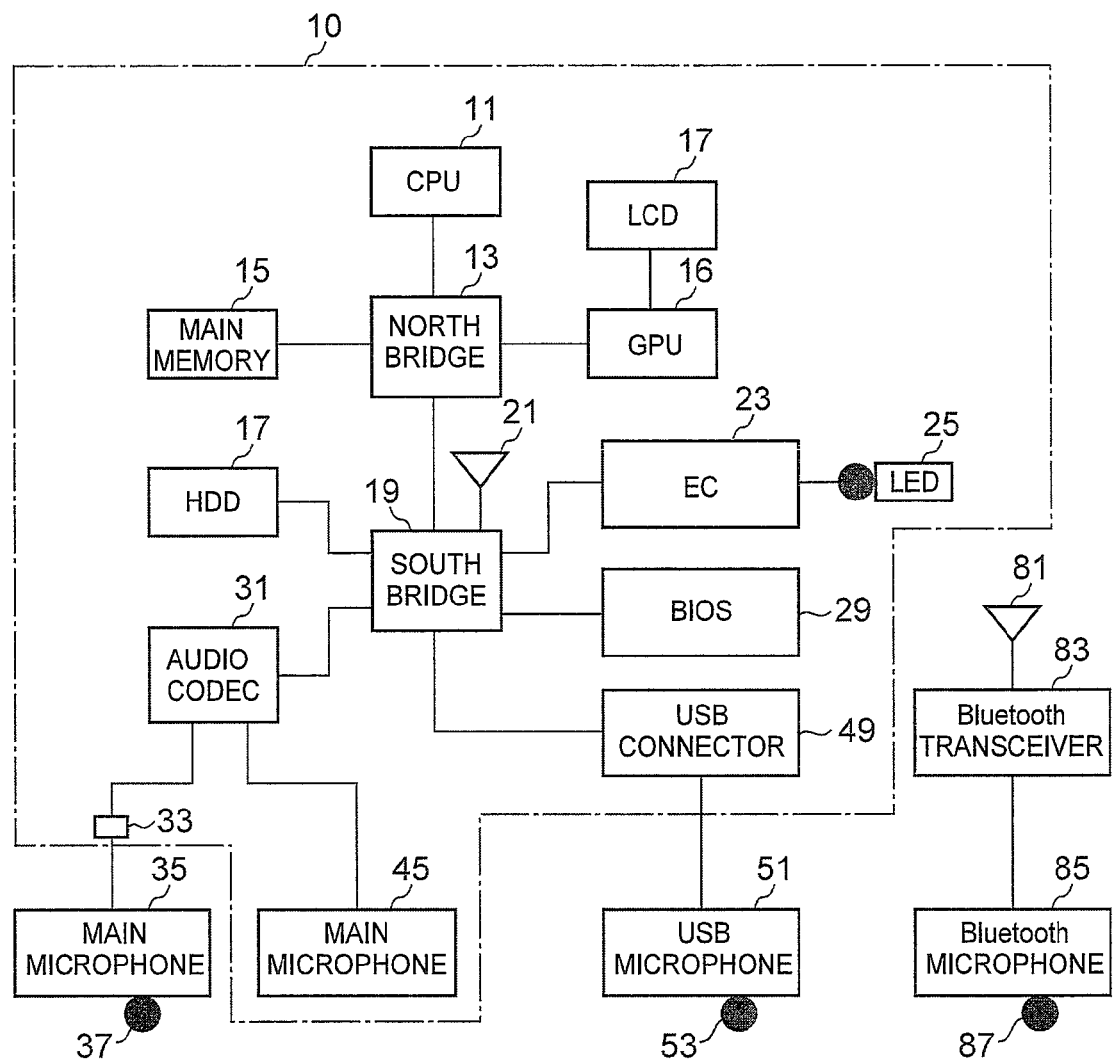
FIG. 1 is a block diagram of a laptop PC having multiple microphones connected thereto.

FIG. 1 is a block diagram of a laptop PC 10 having multiple microphones connected thereto. A central processing unit (CPU) 11 is connected to a north bridge 13 and controls each device of the laptop PC 10 by executing programs. The north bridge 13 is connected to a main memory 15, a graphics processing unit (GPU) 16, and a south bridge 19 and has a memory controller function for controlling an operation of accessing the main memory 15, a data buffer function for absorbing a difference in a data transfer rate between the CPU 11 and other devices, and the like.

The GPU 16 is connected to a Liquid Crystal Display (LCD) 17, provided with a graphic accelerator and a VRAM, and configured to receive a drawing command from the CPU 11 to produce images to be drawn and write the images in the VRAM and to deliver images read from the VRAM to the LCD 17 as rendering data. The main memory 15 is a random access memory used as a read area of programs executed by the CPU 11 and as a work area to which processed data are written. The south bridge 19 includes interface controllers of various standards.

A hard disk drive (HDD) 17 is connected to an HDD interface controller of the south bridge 19, a wireless antenna 21 is connected to a Bluetooth interface controller thereof, and an audio CODEC 31 is connected to a High Definition Audio (HDA) interface thereof. Moreover, a USB connector 49 is connected to a USB interface connector of the south bridge 19, and an embedded controller (EC) 23 and a BIOS-_ROM 29 storing a BIOS are connected to a Low Pin Count (LPC) interface controller thereof.

The HDD 17 stores therein a utility program that performs a mute control in addition to an OS such as Windows Vista® and various device drivers. The wireless antenna 21 is used for data communication with a Bluetooth transceiver 83 connected to a wireless antenna 81. The audio CODEC 31 is connected to main microphones 35 and 45.

Two main microphones are connected to internal audio codec of laptop PC 10. The main microphone 35 is connected to the laptop PC 10 via an audio jack 33 attached to the casing of the laptop PC 10. The main microphone 35 has a mute switch 37. The main microphone 45 is integrated into the casing of the laptop PC 10. The audio CODEC 31 includes a D/A converter that converts digital signals received from the CPU 11 into analog signals and outputs the analog signals to a speaker (not shown) and an A/D converter that converts analog signals input from the main microphones 35 and 45 into digital signals and delivers the analog signals to the CPU 11.

The EC 23 is a microcomputer configured by an 8 to 16 bit CPU, a ROM, a RAM, and the like, and is provided with an multi-channel A/D input terminal, a multi-channel D/A output terminal, a timer, and a digital input/output terminal. The EC 23 is able to execute a program for managing an internal operating environment of the laptop PC 10 independently of the CPU 11. The EC 23 has an A/D terminal to which a LED-attached mute button 25 for microphones is connected. The LED-attached mute button 25 is provided on the casing of the laptop PC 10. In the present embodiment, the LED-attached mute button 25 includes one button and one LED.

The BIOS_ROM 29 is a nonvolatile memory, in which the stored contents are electrically rewritable, and stores therein a Power-On Self Test (POST) for performing tests or initialization of hardware components during the startup, a ACPI BIOS that manages basic input/output operations to devices, a power supply, temperature of a casing, and the like, and programs such as password authentication codes for requesting password authentication to users. The USB connector 49 is connected to a USB microphone 51. The USB microphone 51 is provided with a mute button 53. The Bluetooth transceiver 83 is connected to a Bluetooth microphone 85. The Bluetooth microphone 85 is provided with a mute button 87.

[Software and Hardware Configuration]

Figure 2:
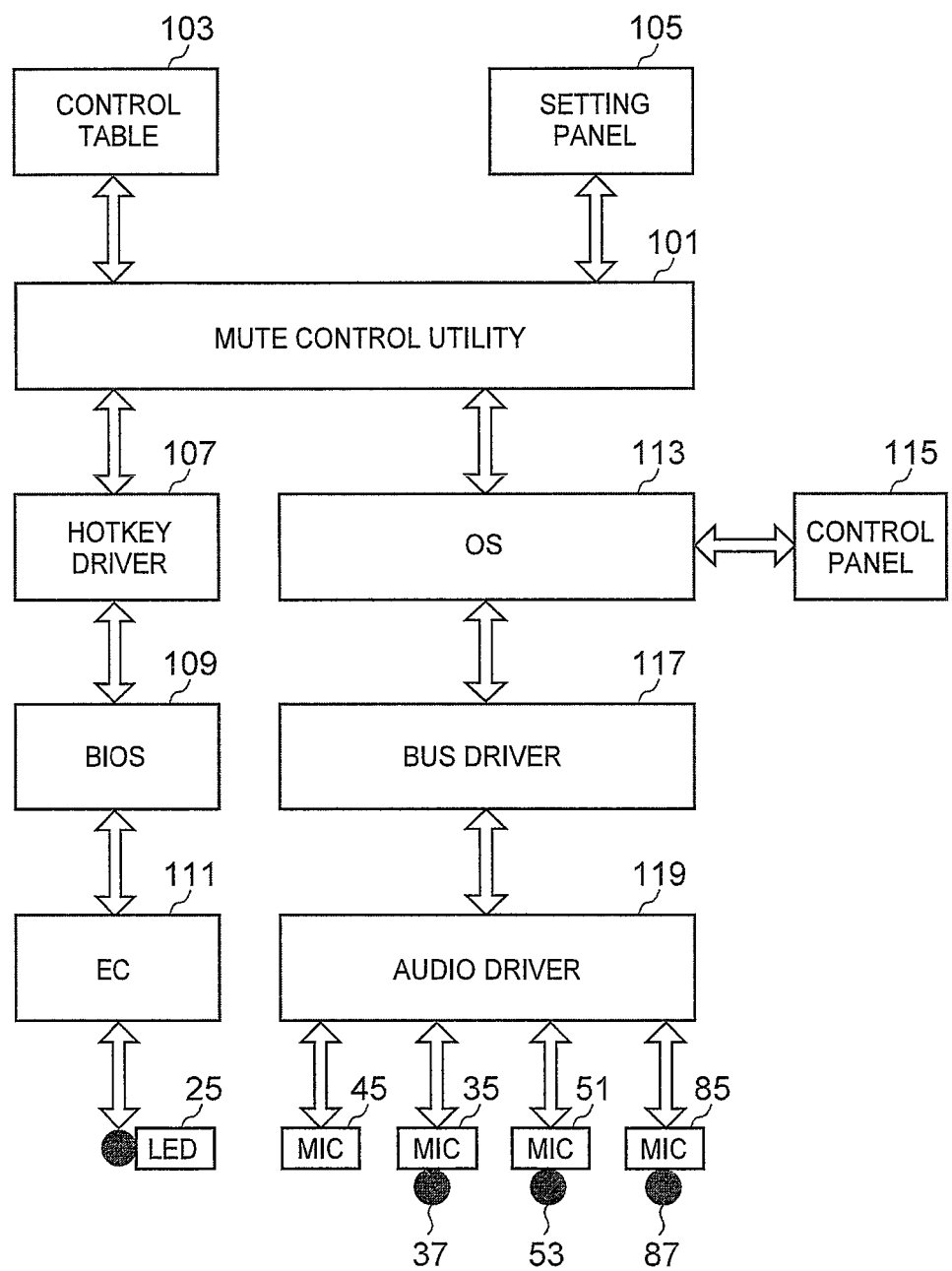
FIG. 2 is a functional block diagram showing a software and hardware configuration for performing a mute control function on multiple microphones.

FIG. 2 is a functional block diagram showing a software and hardware configuration for performing a mute control function on multiple microphones. A mute control utility program 101 is a memory resident program that performs a mute control of microphones using an API of the OS 113. The mute control utility 101 is able to display a setting panel 105 on the LCD 17. A button is displayed on the setting panel 105, enabling a user to select whether a global mute function will be enabled or disabled. The control panel 115 is implemented in the OS 113. When the user enables the global mute function, the global mute is executed by a press of the LED-attached mute button 25 or any of the mute buttons 37, 53, and 87 of the respective microphones. When the user disables the global mute function, a local mute is executed by a press of the mute buttons 37, 53, and 87. A control table 103 stores therein identifiers (device IDs) of the microphones connected to the laptop PC 10, mute control information representing the setting state, namely enable or disable, of the global mute, and mute state information representing either one of the two values, namely a mute state (ON) or an unmute state (OFF).

The device IDs are assigned by the OS 113 having recognized a connection of the microphones so that the microphones can be uniquely identified. The mute control utility 101 is able to receive an event via the EC 23, a BIOS 109, and a hotkey driver 107 when the LED-attached mute button 25 is pressed and to control the lighting and extinguishing of the LED-attached mute button 25 so as to comply with an execution state of the global mute through the above-mentioned elements. The control panel 115 is used for setting the mute state of microphones on a screen displayed on the LCD 17. When the mute control information is enabled, the user is able to execute the global mute by operating the control panel 115 in addition to the mute buttons 25, 37, 53, and 87.

Moreover, when the mute control information is disabled, the user is able to execute the local mute by clicking a button corresponding to a microphone displayed on the control panel 115 in addition to a press of the LED-attached mute button 25 and the mute buttons 37, 53, and 87 of the microphones. In the present embodiment, an operation of the local mute is defined so that the mute control utility 101 is able to display the control panel 115 on the LCD 17, operate the mute buttons 37, 53, and 87, and perform the local mute.

The local mute may be defined, for example, such that all the microphones 45, 35, 51, and 85 are changed to the mute state or the unmute state similar to the global mute when the LED-attached mute button 25 is pressed, or only a corresponding microphone is muted when either one of the mute buttons 37, 53, and 87 or either one of the buttons corresponding to the microphones on the control panel 115 is operated. Alternatively, the local mute may be defined similar to a local mute method that the OS 113 presently has for a speaker.

A bus driver 117 is a program that provides services to devices that are connected to the north bridge 13 and the south bridge 19. An audio driver 119 is a program that controls operations of the microphones 45, 35, 51, and 85 which are connected via an audio CODEC, a USB, and Bluetooth. The control of the pressing and lighting of the LED-attached mute button 25 is not limited to the method of FIG. 2 but may be processed by the same route as the mute button of the microphones through the OS 113, the bus driver 117, and the audio driver 119.

It should be understood that FIGS. 1 and 2 only illustrate the primary hardware constructions related to the present embodiment and the connections in order to describe the present embodiment. In addition to the components described above, many other devices are used for the constitution of the laptop PC 10. However, since these are well known to one having ordinary skill in the art, detailed explanations for them will not be provided here. Of course, various blocks shown in FIGS. 1 and 2 may form a single integrated circuit or device, or one block may be divided into many integrated circuits or devices, and these configurations are also included within the scope of the present invention, so long as one having ordinary skill in the art can arbitrarily select the configurations. Moreover, the types of buses, interfaces and the like connecting the respective devices are only examples, and other types of connection are also included in the scope of the present invention in the range where they can be arbitrarily chosen by those skilled in the art.

[Execution Procedure of Global Mute]

Figure 3:
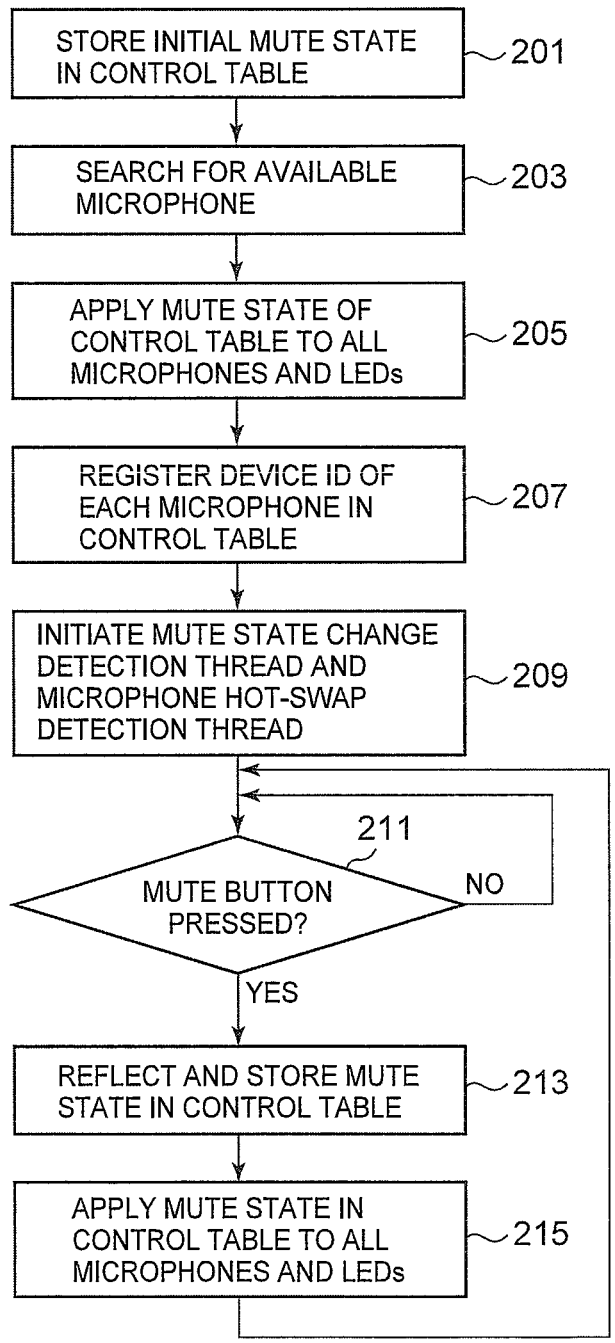
FIG. 3 is a flowchart of an initialization of a utility and a mute process by pressing an LED-attached mute button.
Figure 4:
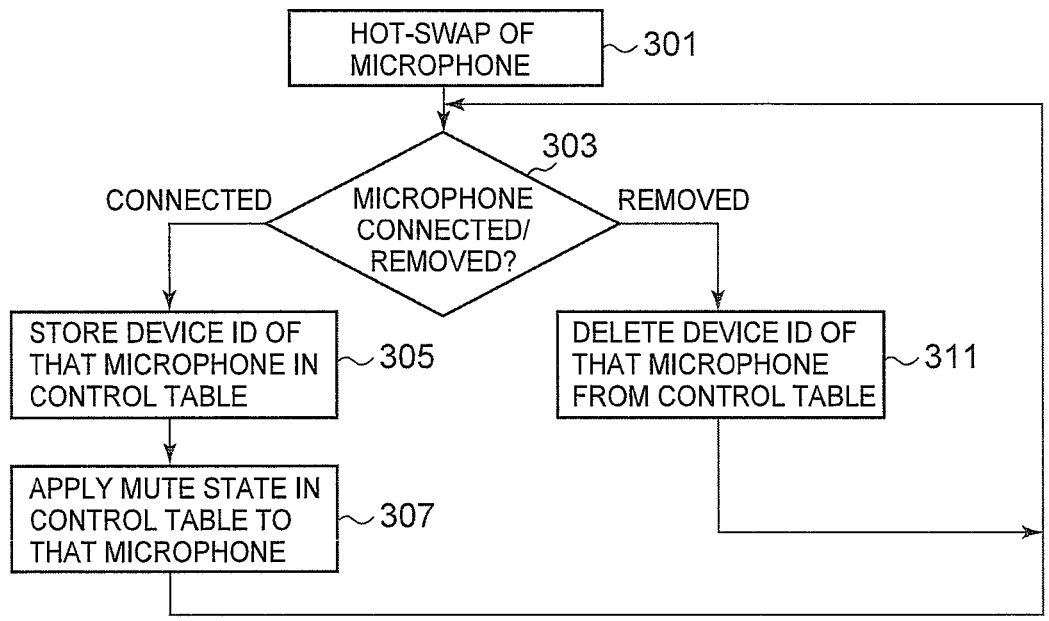
FIG. 4 is a flowchart of a hot-swap process of microphones connected to a laptop PC.
Figure 5:
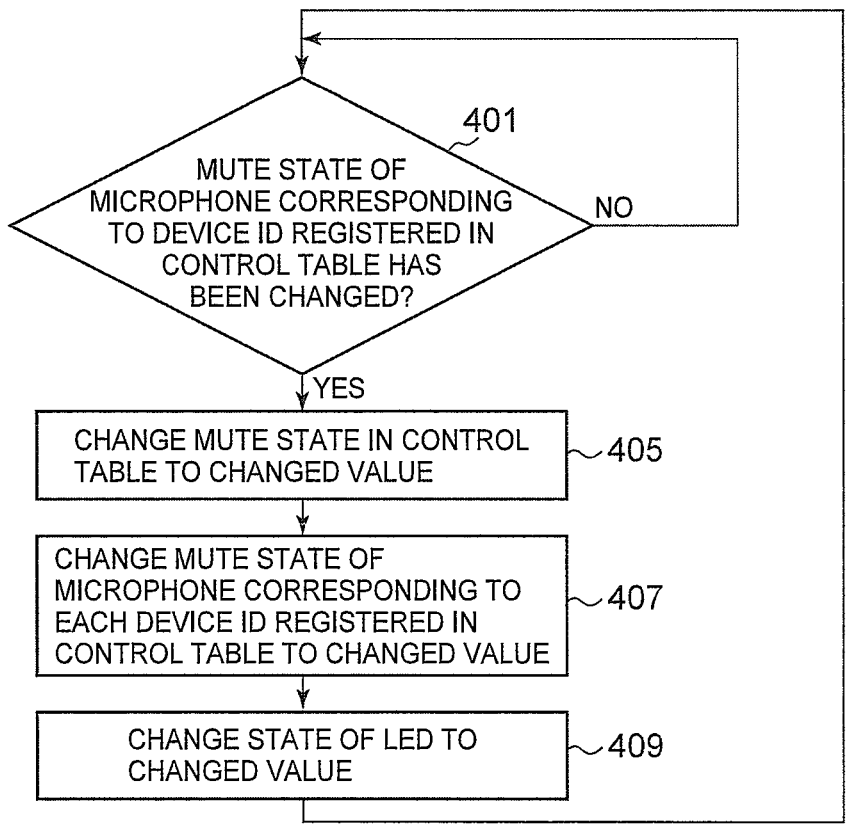
FIG. 5 is a flowchart of a process when a mute button provided to a microphone is pressed so that mute state information is changed.

FIGS. 3 to 5 are flowcharts showing the processes for executing the global mute in the laptop PC 10 to which multiple microphones are connected as shown in FIG. 1. FIG. 3 shows the process of an initialization of the mute control utility 101 and a mute process by a press of the LED-attached mute button 25. FIG. 4 shows the process of a hot-swap process of microphones to the laptop PC 10. FIG. 5 shows the process when a mute button provided to a microphone is pressed so that mute state information is changed. Although the procedures shown in FIGS. 3 to 5 describe respective processes as threads, there are methods that do not use threads.

At block 201 of FIG. 3, the mute control utility 101 is loaded onto the main memory 15 so that the control table 103 is set by the setting panel 105 in advance. In this way, the mute control information is initialized to enable so that the global mute is executed, and the mute state information is initialized to off so that audio data from microphones are transmitted to the CPU 11. When the mute control information is set to disable by the setting panel 105, the local mute is executed and a mute process is performed in accordance with a local mute method defined in the present invention.

At block 203, in response to a demand of the mute control utility 101, the OS 113 searches for microphones presently connected to the laptop PC 10 and informs the mute control utility 101 of device IDs corresponding to the respective microphones. At block 205, the mute control utility 101 applies the mute state information in the control table 103 and requests the OS 113 to change all the mute states of the microphones 45, 35, 51, and 85 corresponding to the device IDs received from the OS 113 to OFF. The OS 113 instructs the audio driver 119 to process the audio data from the respective microphones 45, 35, 51, and 85. At block 205, the mute control utility 101 extinguishes the LED of the LED-attached mute button 25 via the hotkey driver 107, the BIOS 109, and the EC 111.

At block 207, the mute control utility 101 registers the device IDs received from the OS 113 at block 203 in the control table 103. At block 209, the mute control utility 101 initiates a microphone hot-swap detection thread shown in FIG. 4 and a mute state change detection thread shown in FIG. 5. At block 211, the utility 101 waits until it receives a notification of a press of the LED-attached mute button 25 from the hotkey driver 107. When the LED-attached mute button 25 is pressed, the utility 101 inverts the mute state information in the control table 103 from the present OFF state to ON state at block 213.

At block 215, the mute control utility 101 applies the mute state information in the control table 103 stored at block 213 to request the OS 113 to change all the mute states of the microphones 45, 35, 51, and 85 to ON and light the LED of the LED-attached mute button 25 via the hotkey driver 107. Then, the flow returns to block 211, and the mute control utility 101 processes state changes in response to a subsequent press of the LED-attached mute button 25. The mute state information is inverted whenever any of the mute buttons is pressed. When the mute state information is inverted from ON to OFF, the mute control utility 101 applies the mute state information in the control table 103 stored at block 213 to request the OS 113 to change all of the mute states of the microphones 45, 35, 51, and 85 to OFF and extinguish the LED of the LED-attached mute button 25 via the hotkey driver 107, and the flow returns to block 211.

In the present embodiment, even when a new microphone is connected or a connected microphone is removed so that a connection state is changed during the operation of the utility 101 and the execution of the global mute, it is possible to apply the global mute to the changed microphone. At block 301 of FIG. 4, when the connection states of the microphones 35, 51, and 85 are changed during the operation of the laptop PC 10, the OS 113 informs the utility 101 of the change in the connection state. At block 303, when a microphone is connected, the process proceeds to block 305, and when a microphone is removed, the process proceeds to block 311.

At block 305, the mute control utility 101 receives a device ID of the newly connected microphone from the OS 113 and registers the device ID in the control table 103. At block 307, the mute control utility 101 applies the mute state information in the control table 103 to the newly connected microphone to be controlled to be in the same mute state as other microphones. Then, the process returns to block 303, and the mute control utility 101 performs a process of applying the global mute with respect to a subsequent change in the connection state of microphones.

At block 311, the mute control utility 101 receives a device ID of a removed microphone from the OS 113 and deletes the device ID of the removed microphone from the control table 103, and then the flow proceeds to block 303. Since the device IDs and the callback routines in the control table 103 are updated based on a change in the connection state of microphones, the mute control utility 101 is able to process the global mute control based on the updated control table 103.

In FIG. 5, the mute state change detection thread processes the global mute after a mute button provided to a microphone has been pressed. When the main microphone 35, the USB microphone 51, and the Bluetooth microphone 85 are connected, the OS 113 detects a press of any of the mute buttons 37, 53, and 87 at block 401 and informs the mute control utility 101 of a device ID thereof. At block 405, the mute control utility 101 inverts the mute state information in the control table 103 to be changed to a changed value which is either one of the two values ON or OFF.

At block 407, the mute control utility 101 requests the OS 113 to change the states of all the microphones corresponding to the device IDs registered in the control table 103 to the mute state which corresponds to the changed value. At block 409, the mute control utility 101 changes the state of the LED of the LED-attached mute button 25 to the changed value via the hotkey driver 107, the BIOS 109, and the EC 23, and the flow returns to block 401. Although the global mute method has been described with reference to microphones in FIGS. 2 to 5, this method can be applied to speakers.

As has been described, the present invention provides a method for providing a mute control function in a computer to which multiple microphones are connected.

It is also important to note that although the present invention has been described in the context of a fully functional computer, those skilled in the art will appreciate that the mechanisms of the present invention are capable of being distributed as a computer program product in a variety of computer-readable storage medium such as CD ROMs.

While the invention has been particularly shown and described with reference to a preferred embodiment, it will be understood by those skilled in the art that various changes in form and detail may be made therein without departing from the spirit and scope of the invention.

What is claimed is:

1. A method comprising:
    providing a control table within a portable computer having a global mute button, wherein said control table includes mute state information for controlling mute states of microphones;
    searching for all available microphones physically connected to said portable computer, wherein each of said available microphones is associated with a local mute button;
    registering in said control table a device identifiers (ID) of each of said available microphones that is connected to said portable computer;
    detecting for an activation of any one of said mute buttons; and
    in response to a detection of an activation of any one of said mute buttons during a global mute mode, changing said mute state information to apply mute states to all said microphones having corresponding device IDs registered in said control table such that all said microphones will be muted.

2. The method of claim 1, wherein each of said mute buttons is associated with a light.

3. The method of claim 1, wherein said method further includes searching for all available microphones wirelessly connected to said portable computer.

4. The method of claim 1, wherein said method further includes in response to a detection of an activation of one of said mute buttons during a local mute mode, changing said mute state information to apply a mute state to only one of said microphones associated to said one mute button such that only said one microphone will be muted.

5. The method of claim 4, wherein said method further includes allowing a user to select either said global mute mode or said local mute mode.

6. A computer-readable storage device having a computer program product for providing a mute control function for microphones connected to a portable computer, said computer-readable storage device comprising:
    computer program code for providing a control table within a portable computer having a global mute button, wherein said control table includes mute state information is for controlling a mute states of microphones;
    computer program code for searching for all available microphones physically connected to said portable computer, wherein each of said available microphones is associated with a local mute button;
    computer program code for registering in said control table a device identifier (ID) of each of said available microphones that is connected to said portable computer;
    computer program code for detecting for an activation of any one of said mute buttons; and
    computer program code for, in response to a detection of an activation of any one of said mute buttons during a global mute mode, changing said mute state information to apply mute states to all said microphones having corresponding device IDs registered in said control table such that all said microphones will be muted.

7. The computer-readable storage device of claim 6, wherein each of said mute buttons is associated with a light.

8. The computer-readable storage device of claim 6, wherein said computer-readable storage device medium further includes computer program code for searching for all available microphones wirelessly connected to said portable computer.

9. The computer-readable storage device of claim 6, wherein said computer-readable storage device further includes computer program code for, in response to a detection of an activation of one of said mute buttons during a local mute mode, changing said mute state information to apply a mute state to only one of said microphones associated to said one mute button such that only said one microphone will be muted.

10. The computer-readable storage device of claim 9, wherein said computer-readable storage device further includes computer program code for allowing a user to select either said global mute mode or said local mute mode.

11. A portable computer comprising:
    a global mute button;
    a display coupled to a plurality of memories;
    at least one microphones;
    a control table for storing mute state information for controlling mute states of microphones; and
    a processor for
        searching for all available microphones physically connected to said portable computer, wherein each of said available microphones is associated with a local mute button;
        registering in said control table a device identifier (ID) of each of said available microphones that is connected to said portable computer;
        detecting for an activation of any one of said mute buttons; and
        in response to a detection of an activation of any one of said mute buttons during a global mute mode, changing said mute state information to apply mute states to all said microphones having corresponding device IDs registered in said control table such that all said microphones will be muted.

12. The portable computer of claim 11, wherein each of said mute buttons is associated with a light.

13. The portable computer of claim 11, wherein said processor further searches for all available microphones wirelessly connected to said portable computer.

14. The portable computer of claim 1, wherein said processor further changes said mute state information to apply a mute state to only one of said microphones associated to said one mute button such that only said one microphone will be muted, in response to a detection of an activation of one of said mute buttons during a local mute mode.

15. The portable computer of claim 14, wherein said portable computer further allows a user to select either said global mute mode or said local mute mode.

* * * * *